United States Patent [19]

Balusek

[11] Patent Number: 5,359,302
[45] Date of Patent: Oct. 25, 1994

[54] SELF-REGULATING OSCILLATOR CIRCUIT AND METHOD

[75] Inventor: Rudolph D. Balusek, Garland, Tex.

[73] Assignee: Alcatel Network Systems, Inc., Richardson, Tex.

[21] Appl. No.: 904,426

[22] Filed: Jun. 26, 1992

[51] Int. Cl.$^5$ .............................................. H03L 5/00
[52] U.S. Cl. ..................................... 331/109; 331/183
[58] Field of Search ................... 331/109, 183

[56] References Cited

U.S. PATENT DOCUMENTS

| 3,378,791 | 4/1968 | Towner | 331/109 |
| 3,915,048 | 6/1974 | Hamlet | 331/109 |
| 4,626,802 | 12/1986 | Gailus | 331/109 |

Primary Examiner—Andrew M. Dolinar
Attorney, Agent, or Firm—Vinson & Elkins

[57] ABSTRACT

A self-regulating oscillator circuit and method are disclosed. Specifically, a method is described whereby an oscillator having an active device is operated. The oscillator is operated by providing a current through the active device, as well as through a reference device connected in series with the active device of the oscillator. A reference voltage across the reference device is sampled, and a regulated voltage is generated by adding a predetermined voltage to the sampled reference voltage. Finally, the regulated voltage is applied to the active device of the oscillator. In one circuit embodiment, the oscillator as described includes a gallium arsenide FET structure which cooperates with a resonant structure to produce a reflection-type oscillator. In addition, a regulator circuit is described including an isolating op amp which samples the reference voltage from the active device of the oscillator and provides its output to a voltage source device. The voltage source device adds an additional fixed voltage to the sampled voltage and the additional voltage is connected through a pn junction to provide a regulated output voltage. The regulated output voltage is connected to the active device of the oscillator, thereby maintaining the voltage drop across the active device to improve oscillator performance.

14 Claims, 1 Drawing Sheet

SELF-REGULATING OSCILLATOR CIRCUIT AND METHOD

TECHNICAL FIELD OF THE INVENTION

This invention relates in general to oscillators, and more particularly to an oscillator including a self-regulating circuit for ensuring a constant differential voltage across the active device of the oscillator.

BACKGROUND OF THE INVENTION

Oscillator circuits are commonly used in many contemporary circuit applications. Further, as the telecommunications industry advances, higher oscillator frequencies are quite common. For example, under current technology, microwave frequencies on the order of 1 to 300 gigahertz are often used in circuit applications. Typical microwave circuit applications include the use of oscillators for either downward or upward frequency conversion in microwave radio systems. In these microwave applications, as well as for others, it is often very important that the oscillator oscillate only when desired, and that a specific oscillating frequency be maintained during operation. Thus, scientists have invested many years of research and development into building oscillators to meet these goals.

Many different considerations have been examined in order to accomplish the goals set forth above. One key consideration which has been addressed is the bias potential drop across the active device of the oscillating circuit during operation. Specifically, it is beneficial to maintain a constant voltage drop across the active device. This voltage maintenance is important for two reasons. First, a manufacturer of the active device typically provides test data for the device given a specified set of DC criteria. For example, the scattering parameters for the active device are guaranteed by the manufacturer for a stated given DC voltage drop across the active device. Thus, a circuit designer implementing the device typically attempts to match the voltage drop/current flow specified by the manufacturer in order to guarantee these scattering parameters once the active device is operated as part of an oscillator. A second consideration for maintaining a constant voltage drop across an active oscillator device arises from variations in current flow that occur from device-to-device. For example, in a field effect transistor (FET), a known saturation drain-to-source current ($I_{dss}$) is expected to flow through the device. Nonetheless, the specific $I_{dss}$ of an FET is likely to vary from device-to-device. This variation is likely to change the voltage drop across the respective active device. As a result, for oscillators using these devices, oscillation frequency from oscillator-to-oscillator may differ. This result may degrade performance of the overall circuit utilizing the oscillator.

In the prior art, various attempts have been derived in order to individually adjust the voltage drop across the active device of an oscillator. These attempts seek to correct for fluctuations from device-to-device. For example, one technique used in the prior art is to provide an adjustable resistance in series with the active oscillator device and its power supply. The adjustable resistance has been accomplished by way of a potentiometer, or by providing several groups of different values of resistors, any of which may be individually selected and connected between the active device and the power supply. In each instance, the value of the resistance is adjusted or selected to correspondingly adjust the voltage dropped across the resistance. Assuming the supply voltage is constant, this change causes a corresponding change in voltage drop across the active oscillator device in series with the resistance. Accordingly, the voltage drop across the active oscillator device is manually adjustable, thereby allowing bias adjustment and correcting for device-to-device parameter fluctuations.

The manual tuning or selection prior art approaches provide numerous disadvantages. For example, increased time and labor are required for adjusting each oscillator to operate at the necessary or desired voltage bias. Further, these processes quite often require a fairly high degree of technical expertise on the part of the technician. Thus, even with a given level of competence, the manual process is subject to human error. Additionally, device parameter variations may occur after tuning the device. For example, many active devices are known to conduct a different amount of current and, hence, drop a different amount of voltage, when the device is exposed to varying ranges of temperature. As a result, even after a specific oscillator has been hand-tuned, a change of temperature may consequently change the current/voltage biasing the device and, therefore, may alter the oscillation frequency of the device.

In view of the above, it therefore should be appreciated that a need has arisen for an improved circuit and methodology for maintaining the voltage drop across the active device of an oscillator circuit to a given value, thereby minimizing the effects commonly caused by a changing voltage drop.

SUMMARY OF THE INVENTION

In accordance with the present invention, a self-regulating oscillator circuit and method are provided which substantially reduce the disadvantages and problems associated with prior art oscillator circuits.

The present invention includes a method of operating an oscillator having an active device. The method includes providing a current through the active device and a reference device in series with the active device. A reference voltage across the reference device is sampled. Still further, a regulated voltage is generated by adding a predetermined voltage to the reference voltage. Finally, the regulated voltage is applied to the active device.

The circuit and methodology of the present invention give rise to numerous technical advantages. One advantage is improved biasing for an active device in an oscillator which ensures low-phase noise and maximum output power. Another advantage is faster and easier oscillator testing, while eliminating the need for manually adjusting components in order to achieve proper oscillation frequency. Yet another advantage is a controlled amount of biasing voltage applied to the active device, thereby preventing the supply voltage from exceeding a maximum, and potentially destructive, supply voltage specified for the device. Still other advantages of the present invention will be apparent to those of ordinary skill in the art having reference to the following specification, together with its drawings.

BRIEF DESCRIPTION OF THE DRAWINGS

For a more complete understanding of the present invention, and the advantages thereof, reference is now made to the following description taken in conjunction with the accompanying drawings, in which.

DETAILED DESCRIPTION OF THE INVENTION

Figure 1:
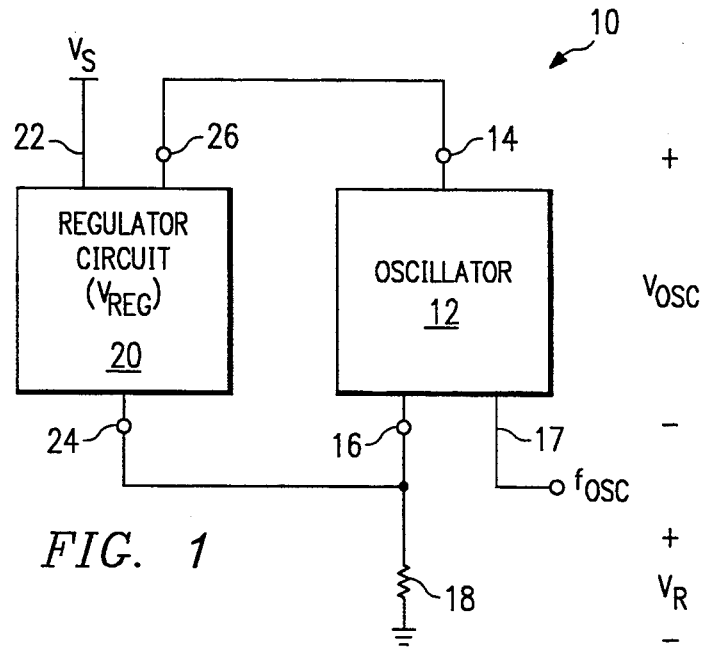
FIG. 1 illustrates a block diagram of the preferred oscillator circuit of the present invention having a voltage regulating circuit for supplying a constant voltage drop across the active device of the oscillator.
Figure 2:
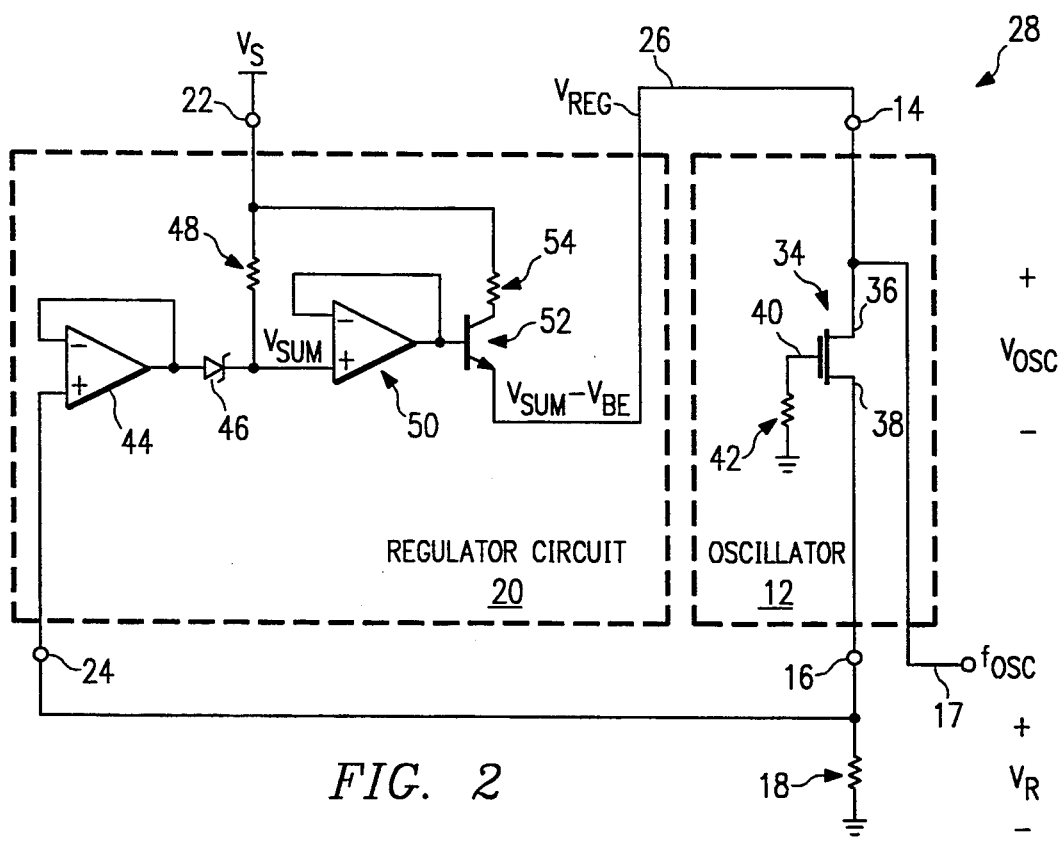
FIG. 2 illustrates a schematic of the preferred oscillator and regulator circuit of the present invention.

The preferred embodiment of the present invention and its advantages are best understood by referring to FIGS. 1–2 of the drawings, like numerals being used for like and corresponding parts of the various drawings.

FIG. 1 illustrates a block diagram of the preferred oscillator system 10 in accordance with the present invention. Oscillator system 10 includes an oscillator 12 having a pair of terminals 14 and 16 for receiving a bias voltage to operate an active device within oscillator 12. Voltage $V_{OSC}$ is defined as the voltage dropped across terminals 14 and 16 of oscillator 12. Oscillator 12 further includes an AC output 17 for producing an output oscillation signal, $f_{osc}$. A resistor 18 is connected between terminal 16 and ground. In the preferred embodiment, the resistance of resistor 18 is chosen by a person having skill in the art to properly adjust the biasing current through oscillator 12. Accordingly, the particular value of resistance depends upon the specific components chosen to implement oscillator 12.

Oscillator 12 is designed according to principles known in the art such that an oscillation signal is provided once certain conditions are met. It should be noted that many types of oscillators could be used as oscillator 12 in FIG. 1. For example, in certain instances, oscillator 12 may be a reflection type oscillator which, by definition, is capable of producing an AC oscillating signal in response to a DC bias. Thus, to oscillate, only a DC biasing signal need be applied between terminals 14 and 16. Moreover, for generating an oscillating signal in the microwave range, oscillator 12 may be a series resonance dielectric resonator oscillator (DRO). As is known in the art, such an oscillator provides an output oscillation signal after two conditions are met. First, the oscillator must receive a DC biasing signal. Second, a resonant structure, such as a puck or cavity, must be coupled to the device by locating it within close proximity to the device. Once these conditions are met, a properly operating DRO will provide a desired output oscillation frequency, $f_{osc}$. For more background information regarding dielectric resonator oscillators, the reader may review "DRO State of the Art" by Chen Y. Ho and Tim Kajita, *Applied Microwave*, Spring 1990, pp. 69–80, and "FET Oscillators Still Require Modeling, But Computer Techniques Simplify the Task" by Kevin J. Anderson and Anthony M. Pavio, *Microwave System News*, September 1983, pp. 60–72, both of which are hereby incorporated by reference.

System 10 further includes a regulator circuit 20 having a DC input 22, a feedback input 24 and a DC supply output 26. DC input 22 is connected to receive a supply voltage, $V_S$. The magnitude of supply voltage $V_S$ is determined by the voltage needs of the entire oscillator system 10. Accordingly, these needs are dictated by the specific components within oscillator 12 and regulator circuit 20, and may be determined by a person having ordinary skill in the art. DC output 26 is connected to terminal 14 of oscillator 12. Feedback input 24 of regulator circuit 20 is connected to terminal 16 of oscillator 12.

The operation of oscillator system 10 is as follows. In general, regulator circuit 20 receives a supply voltage, $V_S$, and maintains a regulated (i.e., constant) voltage drop, $V_{OSC}$, across the active device within oscillator 12. This constant voltage drop renders oscillator 12 operational and, therefore, capable of providing an oscillating signal, $f_{osc}$, at a desired oscillation frequency. In particular, regulator circuit 20 provides a supply voltage, $V_{REG}$, to oscillator 12. Voltage $V_{REG}$ may fluctuate in order to maintain a uniform voltage drop across the active device of oscillator 12. Specifically, regulator circuit 20 samples the voltage across resistor 18, $V_R$, as a reference voltage. Regulator circuit 20 then adds a reference level of voltage to the sampled voltage such that the cumulative voltage from regulator circuit 20 provides the specified biasing voltage drop across the active device of oscillator 12. Thus, if voltage $V_R$ across resistor 18 reduces for any reason, then regulator circuit 20 adjusts $V_{REG}$, thereby maintaining a constant voltage drop across the oscillator active device 12. In other words, because regulator circuit 20 adds a reference voltage to the sampled voltage, its output voltage $V_{REG}$ tracks the sampled voltage. Consequently, if voltage $V_R$ is sampled by regulator circuit 20 and determined to have been reduced, the cumulative voltage $V_{REG}$ provided by regulator circuit 20 is consequently reduced, thereby maintaining an even differential amount of voltage $V_{OSC}$. On the other hand, if the sampled voltage across resistor 18 should increase, regulator circuit 20 adds its reference voltage to this increased voltage and, therefore, continues to maintain a constant voltage drop across the active device of oscillator 12.

From the above, it should be appreciated that regardless of changes in the device parameters of oscillator 12, or the specific type of oscillating circuit used, regulator circuit 20 provides a self-adjusting amount of bias potential in order ensure that the voltage drop, $V_{OSC}$, is maintained at a desired level. In addition, by maintaining the voltage drop at a constant level, a designer can ensure that the level specified by the manufacturer is matched. As discussed above, by matching the manufacturer's biasing specification, the designer is guaranteed that other device parameters (such as scattering parameters) will remain at their respective specified values, thereby ensuring optimum circuit operation and producing the desired output frequency of oscillation.

FIG. 2 illustrates a schematic of an oscillator system 28 constructed according to the preferred embodiment described in connection with FIG. 1, above. Thus, oscillator system 28 includes an oscillator 12 and regulator circuit 20. For purposes of ease of illustration, each of the remaining reference numerals of FIG. 1 are carried forth in FIG. 2. FIG. 2, however, illustrates the schematic of the preferred circuit devices utilized in order to perform the functions of oscillator 12 and regulator circuit 20. These devices and their operation are discussed immediately below.

Oscillator 12 of FIG. 2 includes a series resonant dielectric resonator oscillator (DRO) field effect transistor FET 34 as its active device. For purposes of illustration, with the exception of output 17, only the DC biasing components relating to FET 34 are shown in FIG. 2. Further, while output 17 is shown as connected to drain 36 of FET 34, it should be understood that for other types of configurations, the output oscillation frequency may be taken from different locations on the FET (i.e., either gate or drain), or from different types of active devices altogether (e.g., silicon BJT). With respect to AC components and characteristics, and as is known in the art, for a reflection-type oscillator, DRO FET 34 is commonly constructed of gallium arsenide. Further, FET 34 is connected to various coupling structures such as microstrip lines (not shown) in order to create a device which may be coupled to a resonant structure. Typical resonant structures include a puck or cavity. For more background information regarding gallium arsenide FET oscillators and microstrip coupling, the reader may review "GaAs FET Circuits Begin With Biasing Choices", *Microwaves*, June 1982, pp. 89–91 and "Network Analysis Simplifies the Design of Microwave DROs" by Jwo-Shiun Sun, Long Wu, and Chung-Chuang Wei, *Microwaves & RF*, May 1990, pp. 93–101, both of which are hereby incorporated by reference.

The drain 36 of FET 34 is connected to terminal 14, and the source 38 of FET 34 is connected to terminal 16. Accordingly, a biasing potential may be applied across terminals 14 and 16, thereby causing a current to flow through FET 34 for operation. The gate 40 of FET 34 is connected to a resistor 42 which is further connected to ground. Specifically, gate 40 is preferably terminated to ground through a relatively low impedance for resistor 42, such as on the order of 50 ohms. This gate connection is well-known in the art where a self-biasing technique is used for the oscillator. This connection provides stability to the oscillator in the absence of a resonant structure (i.e., a puck or cavity). Without this stability, FET 34 could inadvertently oscillate before it is coupled to a resonant structure. This oscillation is undesirable because it is preferable that the device operate in its quiescent mode until the resonant structure is coupled to FET 34. Further, without this stability, there is a possibility that oscillator 12 will jump to a so-called parasitic frequency, that is, one other than that which is desired.

Regulator circuit 20 includes a first operational amplifier (op amp) 44 connected in a buffer configuration. Op amp 44 is preferable because it isolates terminal 16 and the internal circuitry of regulator 20, as well as providing a low output impedance function discussed below. The non-inverting input of op amp 44 is connected to feedback input 24. The inverting input of op amp 44 is connected to the output of op amp 44. The output of op amp 44 is further connected to the input of a voltage source device 46. In the preferred embodiment, voltage source device 46 is a zener diode and, therefore, its input, or anode, is connected to the output of op amp 44. The output, or cathode, of voltage source device 46 is connected through a resistor 48 to DC input 22. In addition, the output of voltage source device 46 is connected to the non-inverting input of a second op amp 50. Second op amp 50 is also connected in a buffer configuration. While not mandatory, op amp 50 is preferable because it isolates the output of the zener diode from the circuitry following it in regulator 20. Op amp 50 has its inverting input connected to its output. In addition, the output of op amp 50 is also connected to the base of a bipolar junction transistor (BJT) 52. The collector of BJT 52 is connected through a resistor 54 to DC input 22. The emitter of BJT 52 is connected to the DC supply output 26 of regulator circuit 20.

The overall operation of the preferred circuit components of oscillator 12 and regulator circuit 20 are as follows. Initially, a source voltage, $V_S$, is applied to oscillator system 28. This voltage causes a current to flow through BJT 52 from collector to emitter. This current continues from regulator 20 to oscillator 12 and, in particular, through FET 34. The current through FET 34 causes it to operate and, therefore, causes a voltage drop, $V_{OSC}$, across FET 34. Finally, this current passes through resistor 18, thereby creating a reference voltage, $V_R$, across resistor 18.

The voltage drop across resistor 18, $V_R$, serves as a reference for regulator circuit 20. Specifically, voltage $V_R$ is sampled by feedback input 24 of regulator circuit 20, preferably by buffering it through op amp 44 and applying it to voltage source device 46. Voltage source device 46 provides a fixed voltage supply, $V_{FIX}$. Specifically, the zener diode receives current from source $V_S$ through resistor 48. The output impedance of op amp 44 is relatively low and, therefore, assists in permitting this current to flow through the zener diode. Thus, as is known in the art, this current causes a fixed voltage, $V_{FIX}$, to be generated across the zener diode and, hence, the diode operates as a voltage source. The use of a diode and resistor in this fashion is particularly advantageous because it is highly precise in providing a fixed voltage level. It should be noted, however, that alternative voltage sources, such as a resistive voltage divider or integrated circuit voltage regulator, could be used by a person having skill in the art without departing from the intended invention.

Voltage $V_{FIX}$ supplied by the diode-based voltage source device 46 adds to the buffered voltage output of op amp 44. As a result, the voltage at the output of voltage source device 46, $V_{SUM}$, is:

$$V_{SUM} = V_R + V_{FIX} \qquad \text{Eqn. (1)}$$

The cumulative voltage, $V_{SUM}$, is preferably buffered through second op amp 50 and applied to the base of BJT 52. Because BJT 52 is conducting, one base-to-emitter voltage is dropped across BJT 52 and, therefore, the regulated voltage at its emitter, $V_{REG}$ is:

$$V_{REG} = V_{SUM} - V_{BE} \qquad \text{Eqn. (2)}$$

This regulated voltage is connected to DC supply output 26 and, therefore, terminal 14 of oscillator 12.

In view of the above, it should be appreciated that the voltage input at terminal 14 is directly related to the reference voltage, $V_R$, across resistor 18. Particularly, by substituting equation (1) into equation (2), the regulated voltage provided by regulator circuit 20 is:

$$V_{REG} = V_R + V_{FIX} - V_{BE} \qquad \text{Eqn. (3)}$$

Thus, the relationship of the regulated voltage, $V_{REG}$, is shown to depend on the sampled voltage $V_R$, and to be adjusted by the voltage of source device 46 and the drop across the base-to-emitter pn junction of BJT 52. Further, as long as the latter two voltages remain constant, then the regulated voltage tracks the sampled voltage, but remains $V_{FIX} - V_{BE}$ higher than the sampled voltage. Accordingly, the voltage drop, $V_{OSC}$, across the active device of oscillator 12 is:

$$V_{OSC} = V_{REG} - V_R = V_{FIX} - V_{BE} \qquad \text{Eqn. (4)}$$

From equation (4), it therefore should be appreciated that a designer may select a voltage source device 46 which, after dropping one $V_{BE}$, provides the fixed desired amount of voltage drop across oscillator 12.

Given equation (4), above, it should now be understood that even if the voltage $V_R$ across resistor 18 is reduced for some reason, the regulated output voltage is correspondingly reduced, thereby maintaining a uniform voltage drop, $V_{OSC}$, across oscillator 12. Thus, as stated above, for a given FET, its $I_{dss}$ may be relatively low, thereby reducing the voltage dropped across resistor 18. If the voltage applied to oscillator 12 were constant, then the decrease in voltage across resistor 18 would increase the voltage across oscillator 12. This increase could cause adverse effects on the operation, or the oscillation frequency, $f_{osc}$, of oscillator 12. The inclusion of regulator circuit 20, however, corrects for the drop in voltage across resistor 18 and, therefore, maintains a desired voltage drop across oscillator 12. If, with the present invention, an FET were selected with a relatively high $I_{dss}$, then while a high voltage will be dropped across resistor 18, the voltage supply to oscillator 12 correspondingly will be increased as regulator circuit 20 tracks the increased voltage across resistor 18.

It should also be noted that current through FET 34 and resistor 18 is limited by resistor 54. Thus, depending on the operational characteristics and maximums specified for the circuit, a person having ordinary skill in the art may select a desired resistance value for resistor 54 to ensure that only a limited amount of current may flow if, for some reason, FET 34 short-circuits. Thus, the preferred embodiment includes the combination of BJT 52 and resistor 54 not only to add an adjustment to the regulated voltage drop $V_{OSC}$ across oscillator 12, but to add current flow protection as well.

From the above, it should be appreciated that regulator circuit 20 operates in a fashion to sample the voltage dropped across resistor 18 and automatically modify the supply voltage to oscillator 12. The automatic adjustment of voltage by regulator circuit 20 maintains a constant and specified level of voltage across oscillator 12, thereby ensuring that the oscillator continues to operate at the desired biasing level. Moreover, a current limiting feature is provided by regulator circuit 20 to reduce the possibility of damage to the oscillator which could otherwise occur due to excessive current flow through the circuit. Additionally, by regulating the voltage to the active device, any maximum voltage level may be avoided, thereby ensuring the device is not damaged or destroyed by excessive voltage. Further, although the present invention and its advantages have been described in detail, it should be understood that various changes, substitutions, and alterations can be made to the invention without departing from its spirit and scope. For example, as stated above, various different types of oscillating circuitry could be used within oscillator 12. In a similar manner, the components of regulator circuit 20 may also be changed by a person having skill in the art without departing from the concept of tracking the reference voltage provided by the oscillator. Still other examples follow from the previous description and in no way should depart from the scope of the present invention as defined by the following claims.

What is claimed is:

1. A method of operating an oscillator having an active device for providing an oscillating signal and comprising a first and second biasing terminal, comprising:

providing a DC biasing current from said first biasing terminal through said second biasing terminal of said active device;

coupling a portion of said DC biasing current through a reference device coupled to said second biasing terminal of said active device, said portion of said DC biasing current generating a DC reference voltage across said reference device;

feeding back said DC reference voltage in a feedback path to a voltage regulator such that said active device is coupled within said feedback path;

generating a regulated voltage by adding a predetermined voltage to said DC reference voltage; and applying said regulated voltage between said first and second biasing terminals of said active device.

2. The method of claim 1 and further comprising limiting said current through said active device and said reference device.

3. The method of claim 1 wherein said step of generating a regulated voltage comprises:

adding a voltage across a zener diode to said reference voltage to form a sum voltage; and dropping said sum voltage across a base-to-emitter junction of a bipolar junction transistor.

4. The method of claim 1 and further comprising buffering said reference voltage before said step of generating a regulated voltage.

5. An oscillator circuit, comprising:

an active device having a first and second DC biasing terminal, wherein said active device is operable in response to a biasing potential placed between said first and second DC biasing terminals;

a reference device coupled to said second DC biasing terminal of said active device, said reference device for receiving a DC current generating a DC reference voltage across said reference device;

a feedback path coupled to said second terminal for providing a connection to sample said DC reference voltage; and a regulator circuit coupled to said first and second terminals and said feedback path such that said feedback path includes said active device, wherein said regulator circuit is for providing said biasing potential to said first terminal in response to said DC reference voltage at said second terminal by adding a predetermined voltage to said DC reference voltage.

6. The oscillator circuit of claim 5 wherein said active device comprises a silicon bipolar junction transistor.

7. The oscillator circuit of claim 5 wherein said active device comprises a field effect transistor.

8. The oscillator circuit of claim 7 wherein said first terminal comprises a drain and wherein said second terminal comprises a source, and wherein said regulator circuit comprises:

a buffer circuit having an input connected to said source; and a source voltage diode having an input connected to an output of said buffer circuit, wherein an output of said source voltage diode is for providing a sum voltage.

9. The oscillator circuit of claim 8 wherein said buffer circuit comprises a first buffer circuit, and further comprising:

a second buffer circuit having an input connected to said output of said source voltage diode; and a pn junction having a p input connected to an output of said second buffer and having an n output connected to said source such that said biasing potential is produced at said n output of said pn junction.

10. An oscillator circuit, comprising:
a field effect transistor capable of producing an output signal oscillating at a predetermined frequency, said field effect transistor comprising a drain and a source for receiving a biasing potential;
a resistor connected between said source and ground; and
means for maintaining a constant voltage drop across said source and drain, wherein said means for maintaining a constant voltage comprises means for adding a regulated voltage to a voltage across said resistor.

11. The oscillator circuit of claim 10 wherein said means for adding a regulated voltage comprises:
a zener diode having an anode and a cathode;
a resistor connected between said cathode of said zener diode and a voltage supply; and
a low impedance connected to said anode of said zener diode such that current may flow through said zener diode when said voltage supply is activated, thereby generating said regulated voltage across said zener diode.

12. A method of operating an oscillator having an active device, comprising:
providing a current through said active device and a reference device in series with said active device;
sampling a reference voltage across said reference device;
generating a regulated voltage by adding a predetermined voltage to said reference voltage, wherein said step of generating a regulated voltage comprises:
adding a voltage across a zener diode to said reference voltage to form a sum voltage; and
dropping said sum voltage across a base-to-emitter junction of a bipolar junction transistor; and
applying said regulated voltage to said active device.

13. An oscillator circuit, comprising:
a field effect transistor comprising a drain and a source, wherein said field effect transistor is operable in response to a biasing potential placed between said drain and said source; and
a regulator circuit coupled to said source and said drain, wherein said regulator circuit is for providing said biasing potential to said source in response to a potential at said drain, and wherein said regulator circuit comprises:
a buffer circuit having an input connected to said source; and
a source voltage diode having an input connected to an output of said buffer circuit, wherein an output of said source voltage diode is for providing a sum voltage.

14. The oscillator circuit of claim 13 wherein said buffer circuit comprises a first buffer circuit, and further comprising:
a second buffer circuit having an input connected to said output of said source voltage diode; and
a pn junction having a p input connected to an output of said second buffer and having an n output connected to said source such that said biasing potential is produced at said n output of said pn junction.

* * * * *